United States Patent
Cai et al.

(10) Patent No.: US 9,536,877 B2
(45) Date of Patent: Jan. 3, 2017

(54) METHODS OF FORMING DIFFERENT SPACER STRUCTURES ON INTEGRATED CIRCUIT PRODUCTS HAVING DIFFERING GATE PITCH DIMENSIONS AND THE RESULTING PRODUCTS

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Schenecdtady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/195,484

(22) Filed: Mar. 3, 2014

(65) Prior Publication Data

US 2015/0249036 A1    Sep. 3, 2015

(51) Int. Cl.
| | | |
|---|---|---|
| *H01L 27/088* | (2006.01) | |
| *H01L 23/485* | (2006.01) | |
| *H01L 21/768* | (2006.01) | |
| *H01L 23/532* | (2006.01) | |

(52) U.S. Cl.
CPC ....... *H01L 27/088* (2013.01); *H01L 21/76831* (2013.01); *H01L 21/76897* (2013.01); *H01L 23/485* (2013.01); *H01L 23/53257* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,565,372 | A * | 10/1996 | Kim ................... | H01L 23/5225 |
| | | | | 257/E23.152 |
| 6,228,731 | B1 * | 5/2001 | Liaw et al. .................... | 438/303 |
| 2007/0034967 | A1 * | 2/2007 | Nayfeh et al. ................ | 257/369 |
| 2008/0296637 | A1 * | 12/2008 | Shin et al. .................... | 257/288 |
| 2010/0330794 | A1 * | 12/2010 | Kurisu et al. ................. | 438/592 |
| 2012/0028434 | A1 * | 2/2012 | Lee et al. ...................... | 438/400 |

\* cited by examiner

*Primary Examiner* — Kimberly Rizkallah
*Assistant Examiner* — Bo Bin Jang
(74) *Attorney, Agent, or Firm* — Amerson Law Firm, PLLC

(57) ABSTRACT

One example disclosed herein involves forming source/drain conductive contacts to first and second source/drain regions, the first source/drain region being positioned between a first pair of transistor devices having a first gate pitch dimension, the second source/drain region being positioned between a second pair of transistor devices having a second gate pitch dimension that is greater than the first gate pitch dimension, wherein the first and second pairs of transistor devices have a gate structure and sidewall spacers positioned adjacent the gate structure.

16 Claims, 9 Drawing Sheets

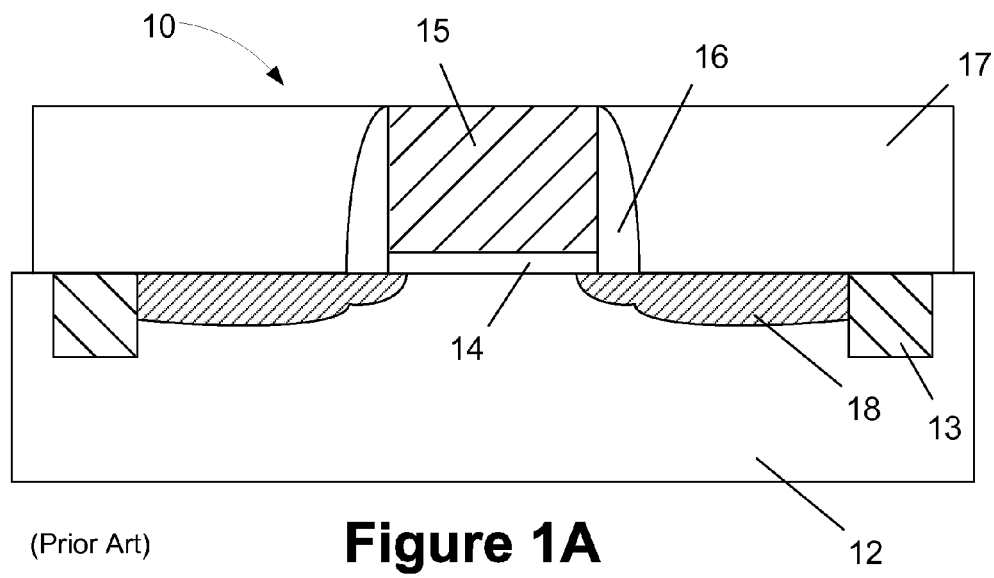
(Prior Art) Figure 1A
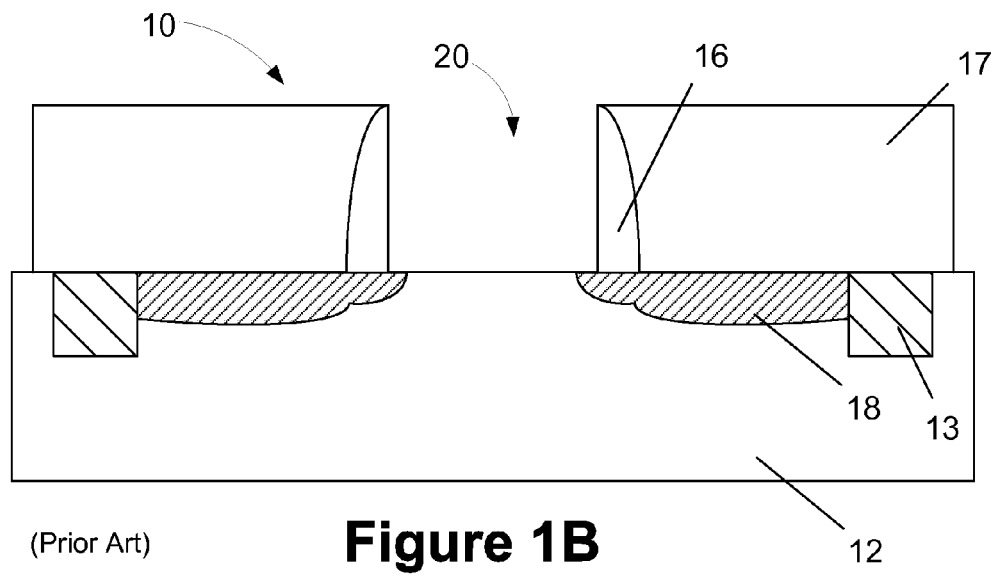
(Prior Art) Figure 1B

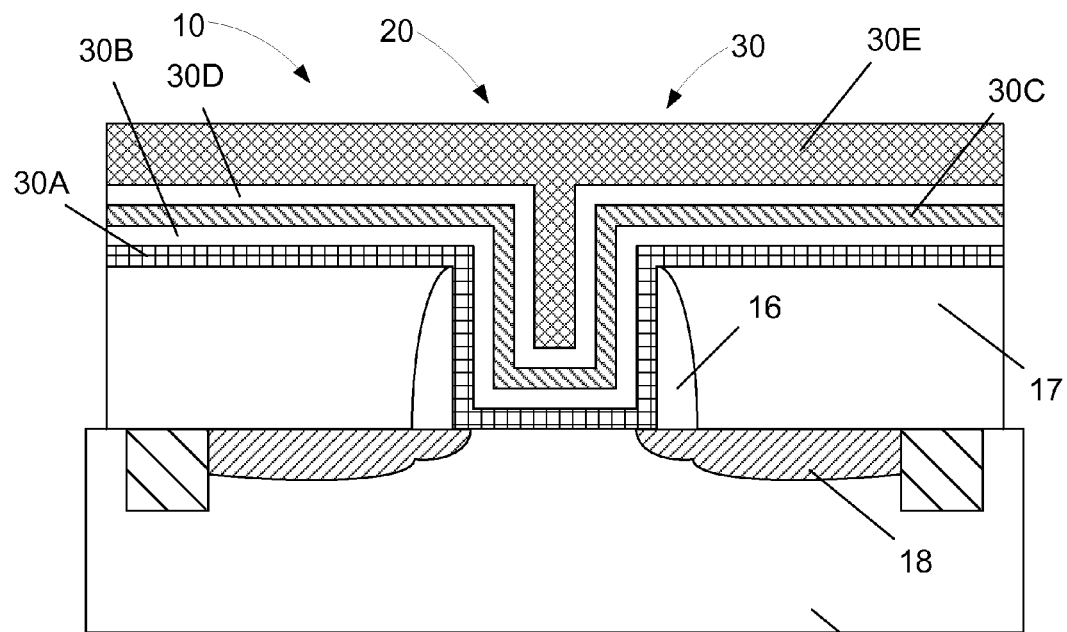
(Prior Art) Figure 1C
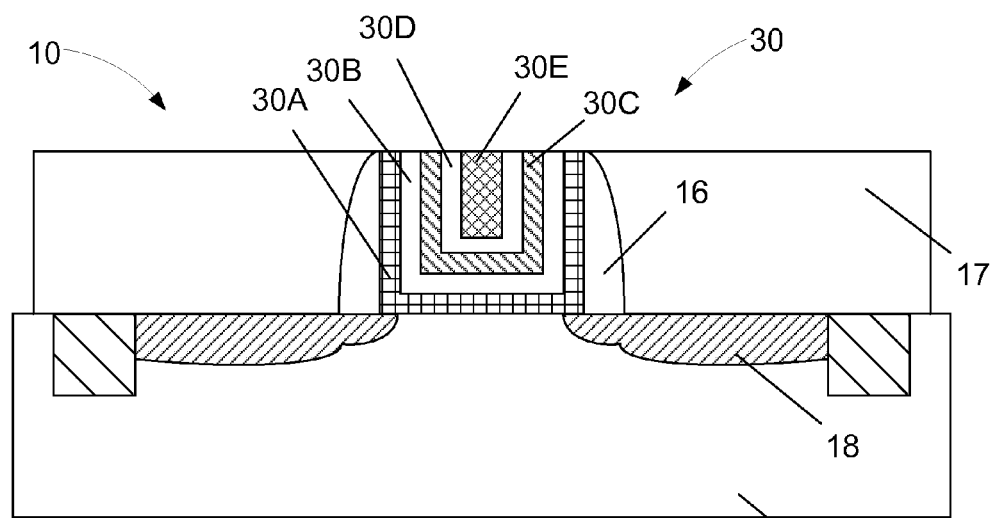
(Prior Art) Figure 1D

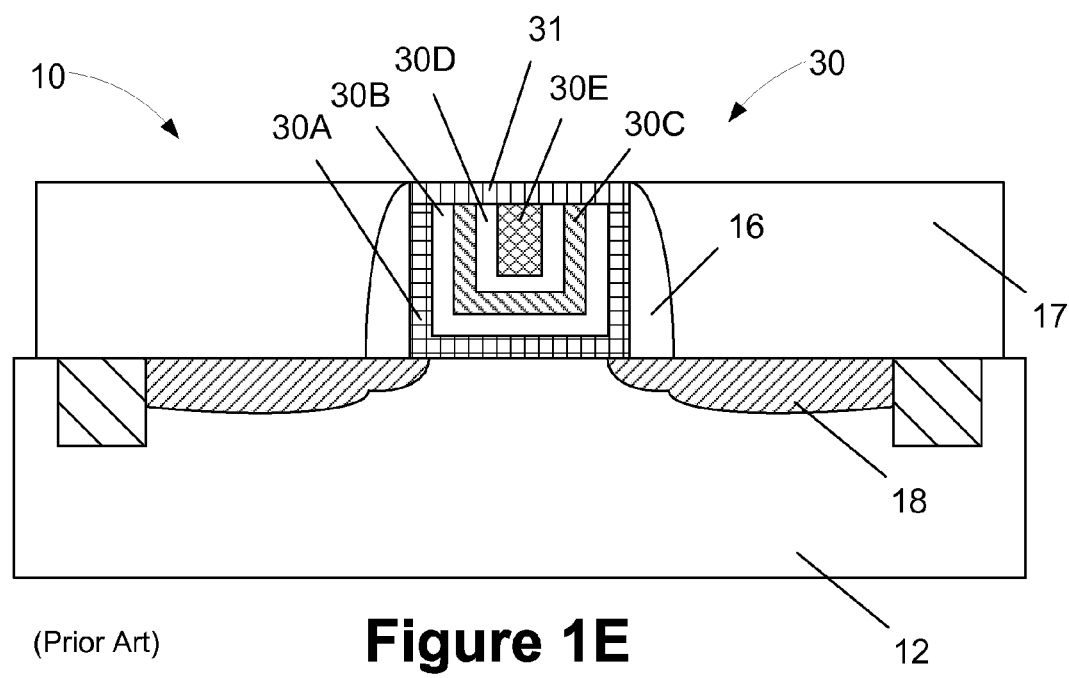
(Prior Art) Figure 1E

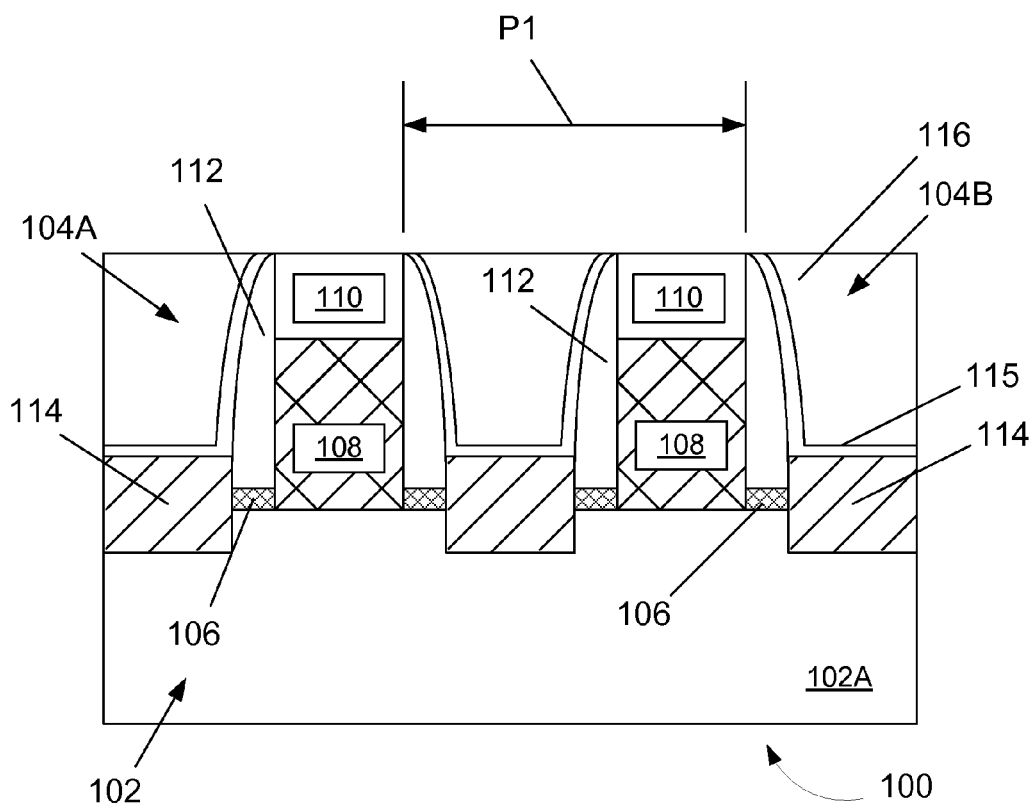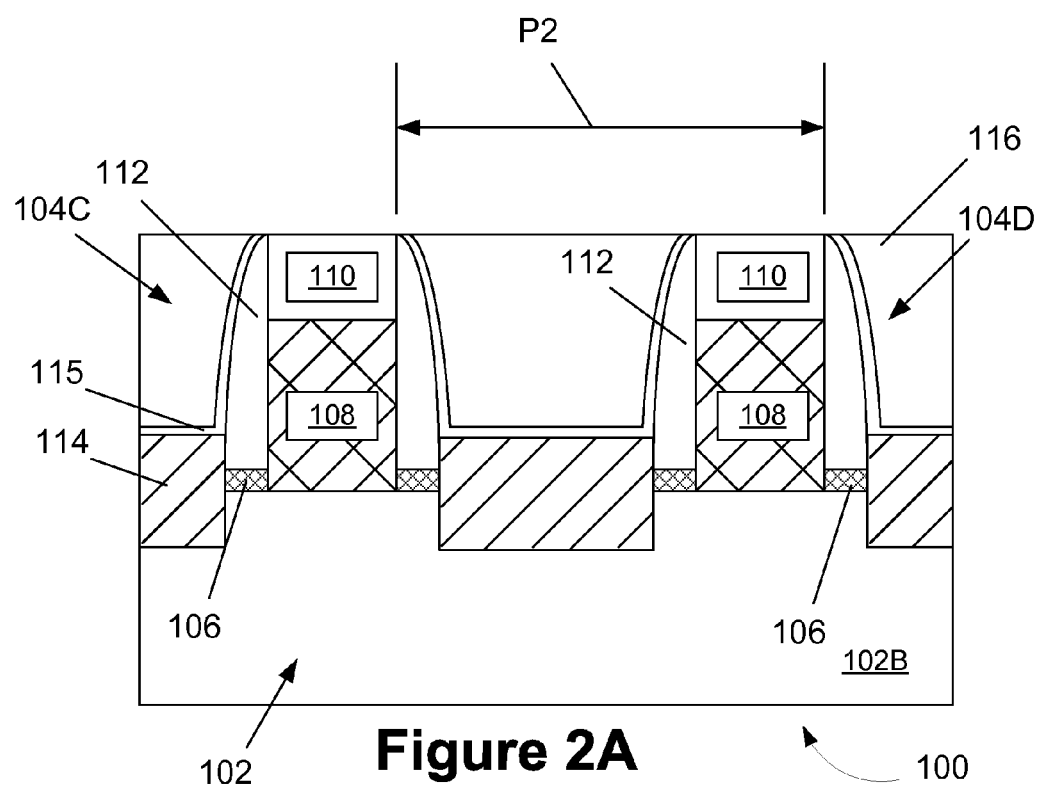
Figure 2A

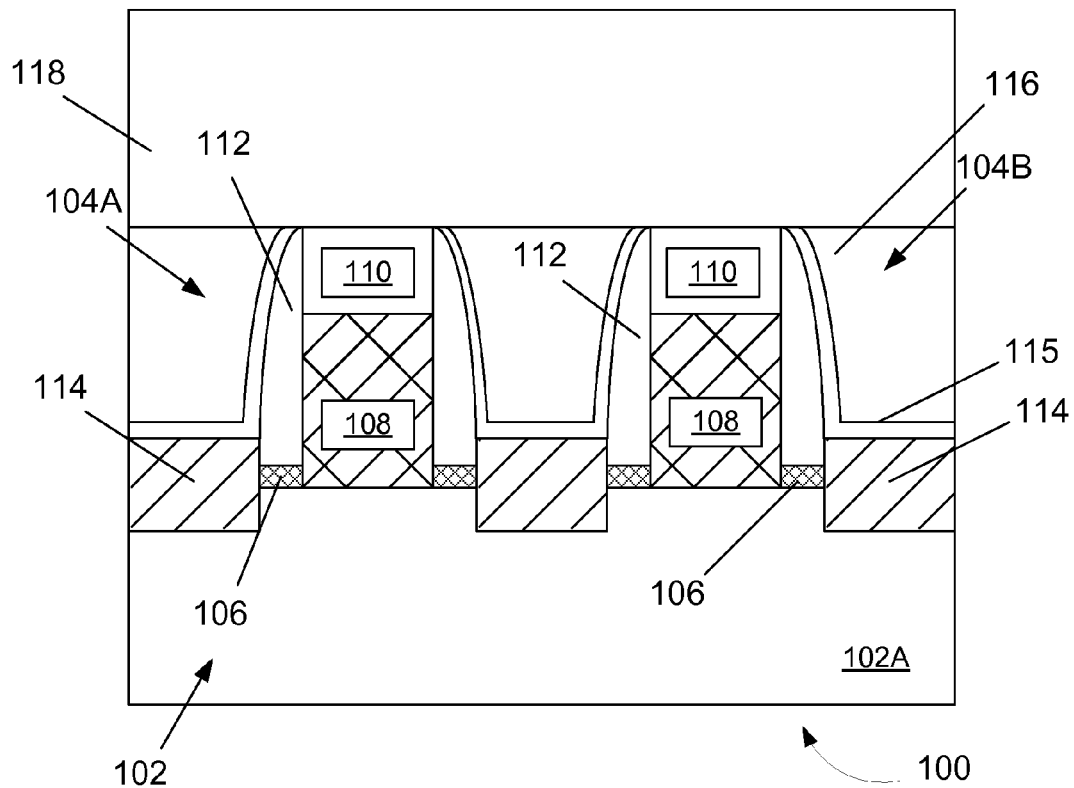
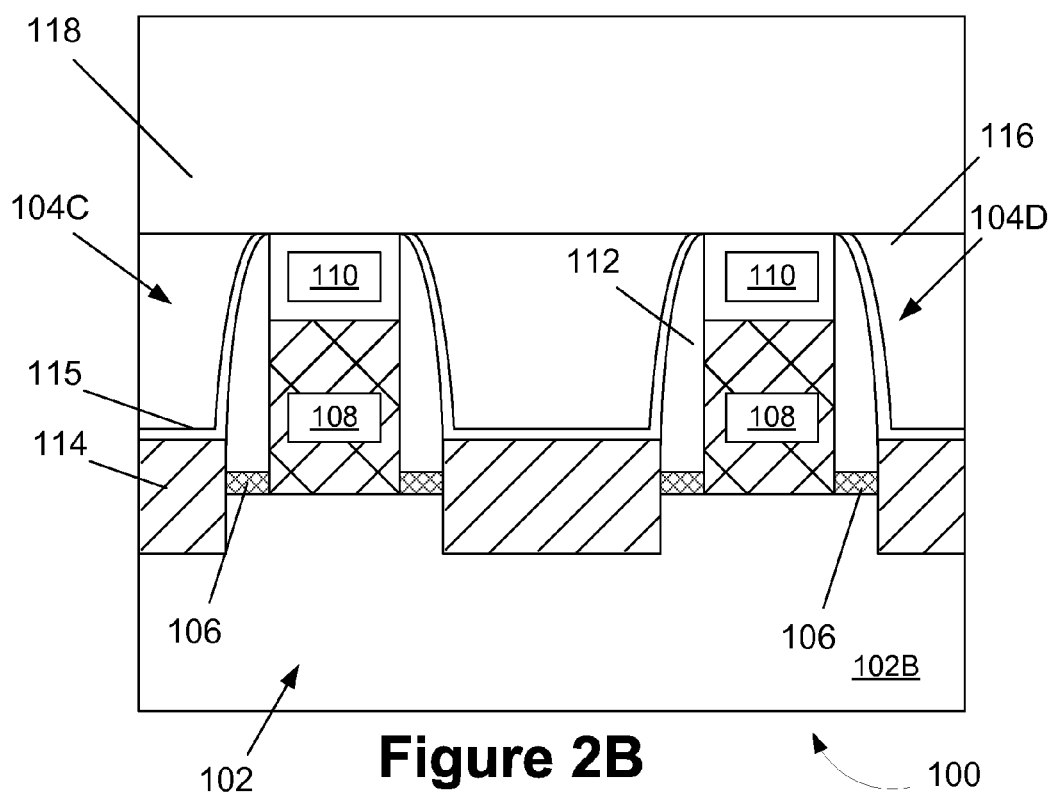
Figure 2B

METHODS OF FORMING DIFFERENT SPACER STRUCTURES ON INTEGRATED CIRCUIT PRODUCTS HAVING DIFFERING GATE PITCH DIMENSIONS AND THE RESULTING PRODUCTS

BACKGROUND OF THE INVENTION

1. Field of the Invention

The present disclosure generally relates to the fabrication of integrated circuits, and, more particularly, to various methods of forming different spacer structures on integrated circuit products having different gate pitch dimensions and the resulting products.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source and drain regions that are formed in a semiconducting substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

Immense progress has been made over recent decades with respect to increased performance and reduced feature sizes of circuit elements, such as transistors. However, the ongoing demand for enhanced functionality of electronic devices has forced semiconductor manufacturers to steadily reduce the dimensions of the circuit elements and to increase the operating speed of the circuit elements. The continuing scaling of feature sizes, however, involves great efforts in redesigning the structure of the devices, the process techniques and developing new process strategies and tools so as to comply with new design rules. More specifically, to improve the operating speed of FETs, and to increase the density of FETs on an integrated circuit device, device designers have greatly reduced the physical size of FETs over the past decades. That is, the channel length of planar FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel region of a planar FET device from being adversely affected by the electrical potential of the drain region. This is sometimes referred to as a so-called short channel effect, wherein the characteristic of the planar FET as an active switch is degraded.

As noted above, in contrast to a planar FET, which has a substantially planar structure, a so-called FinFET device has a three-dimensional (3D) structure. The basic features of a FinFET device include one or more vertically oriented fins that span the channel region of the device and the source/drain regions, a gate structure positioned around the exposed portions of the fins in the channel region of the device, a gate cap layer positioned above the gate electrode of the gate structure, and sidewall spacers positioned adjacent the gate structure and the gate cap layer. The sidewall spacers and gate cap layer protect the gate structure during subsequent processing operations. The gate structure may be comprised of a layer of insulating material, e.g., a layer of high-k insulating material or silicon dioxide, and one or more conductive material layers (e.g., metal and/or polysilicon) that serve as the gate electrode for the device. As noted above, the fins have a three-dimensional configuration: a height, a width and an axial length. The axial length corresponds to the direction of current travel in the device when it is operational. The portions of the fins covered by the gate structure are the channel regions of the FinFET device. In a conventional process flow, the portions of the fins that are positioned outside of the spacers, i.e., in the source/drain regions of the device, may be increased in size or even merged together by performing one or more epitaxial growth processes to form epi semiconductor material on the portions of the fins in the source/drain regions of the FinFET device. The process of increasing the size of or merging the fins in the source/drain regions of the FinFET device is performed for various reasons, e.g., to reduce the resistance of source/drain regions and/or to make it easier to establish electrical contact to the source/drain regions, etc. Even if an epi "merge" process is not performed, an epi growth process will typically be performed on the fins in the source/drain regions of the device to increase their physical size. In a FinFET device, the gate structure may enclose both sides and the upper surface of all or a portion of the fins to form a tri-gate structure so as to result in a channel having a three-dimensional structure instead of a planar structure. In some cases, an insulating cap layer, e.g., silicon nitride, is positioned at the top of the fins and the FinFET device only has a dual-gate structure (fin sidewalls only).

Thus, unlike a planar FET, in a FinFET device, a channel is formed perpendicular to the upper surface of the semiconducting substrate, thereby reducing the physical size of the FinFET device. Also, in a FinFET device, the junction capacitance at the drain region of the device is greatly reduced, which tends to significantly reduce short channel effects. When an appropriate voltage is applied to the gate electrode of a FinFET device, the surfaces (and the inner portion near the surface) of the fins, i.e., the vertically oriented sidewalls and the top upper surface of the fin (for a tri-gate device), form a surface inversion layer or a volume inversion layer that contributes to current conduction. In a FinFET device (tri-gate), the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar FET devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior structure as compared to that of a planar FET, especially in the 20 nm CMOS technology node and beyond. The gate structures for such FinFET devices may also be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate structure—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1E simplistically depict one illustrative prior art method for forming an HK/MG replacement gate structure using a replacement gate technique on a planar transistor device. As shown in FIG. 1A, the process includes the formation of a basic transistor structure above a semiconductor substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1C, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1E depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

Another issue that has become more important as a result of the decrease in device dimensions and the corresponding increase in packing densities is the parasitic capacitors that are created which may act to reduce the operating speed of transistor devices. Typically, as noted above, the gate structure of a transistor will include at least one sidewall spacer positioned adjacent the gate structure. The sidewall spacers are typically made of silicon nitride (which has a relatively high k-value of, e.g., about 7-8) and they are normally formed very soon after the sacrificial gate structure is formed for devices manufactured using the replacement gate technique. For replacement gate structures, two of the primary purposes of the silicon nitride spacers are to define the gate cavity in the replacement gate manufacturing process and to protect the final replacement gate structure. Conductive contacts, such as self-aligned contacts, are formed and conductively coupled to the source/drain regions of the device. As a result of the structure of the transistors, a gate-to-contact capacitor is generally defined, wherein the gate electrode of the replacement gate structure functions as one of the conductive plates of the capacitor and the source/drain contact functions as the other conductive plate of the capacitor. The presence of the silicon nitride spacer material (with a relatively high k-value) tends to increase the parasitic capacitance between the conductive gate electrode and source/drain contacts. This problem has become even more problematic as packing densities have increased which causes the gate structures of adjacent transistors to be positioned ever closer to one another. Unfortunately, the gate-to-contact capacitor tends to slow down the switching speed of the transistor as this capacitor must be charged and discharged each time the transistor is turned on-off.

The present disclosure is directed to various methods of forming different spacer structures on integrated circuit products having different gate pitch dimensions and the resulting products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming different spacer structures on integrated circuit products having different gate pitch dimensions and the resulting products. One example disclosed herein involves forming source/drain conductive contacts to first and second source/drain regions, the first source/drain region being positioned between a first pair of transistor devices having a first gate pitch dimension, the second source/drain region being positioned between a second pair of transistor devices having a second gate pitch dimension that is greater than the first gate pitch dimension, wherein the first and second pairs of transistor devices have a gate structure and sidewall spacers positioned adjacent the gate structure. More specifically, one method disclosed herein involves, among other things, forming a first layer of insulating material above the first and second source/drain regions, forming a second layer of insulating material above the first layer of insulating material, forming first and second contact openings above the first and second source/drain regions, wherein forming the first contact opening removes substantially all of the first layer of insulating material positioned above the first source/drain region and between facing sidewall spacers on the first pair of transistor devices having the first gate pitch, and wherein forming the second contact opening removes some, but not all, of the first layer of insulating material positioned above the second source/drain region and between facing sidewall spacers on the second pair of transistor devices having the second gate pitch, the second contact opening extending through a portion of the first layer of insulating material, performing an etching process through the first contact opening to remove the facing sidewall spacers on the first pair of transistor devices and thereby expose facing edges of the gate structures on the first pair of transistor devices, performing a common deposition and etch process sequence to form first and second low-k sidewall spacers within the first and second contact openings, respectively, wherein the first low-k sidewall spacer contacts the exposed facing edges of the gate structure of the first pair of transistor devices and the second low-k sidewall spacer is formed on the first layer of insulating material within the second contact opening, and forming the source/drain conductive contacts in the first and second contact openings.

One illustrative product disclosed herein includes, among other things, a first pair of transistor devices having a first gate pitch dimension formed above a semiconductor substrate, the first pair of transistor devices each having a gate structure, a first source/drain region positioned between the first pair of transistor devices, a second pair of transistor devices having a second gate pitch dimension formed above the semiconductor substrate, the second pair of transistor devices each having a gate structure and sidewall spacers positioned adjacent the gate structure, the second gate pitch dimension being greater than the first gate pitch dimension, a second source/drain region positioned between the second pair of transistor devices, a first layer of insulating material positioned above the first and second source/drain regions, first and second source/drain conductive contacts that are conductively coupled to the first and second source/drain regions, respectively, a first low-k spacer positioned between the gate structures of the first pair of transistors and the first source/drain conductive contact, wherein the first low-k spacer is positioned on and in contact with a portion of the gate structure of each of the first pair of transistor devices, and a second low-k spacer positioned between the gate structures of the second pair of transistor devices and the second source/drain conductive contact, wherein the second low-k spacer is positioned on and in contact with the layer of insulating material and wherein portions of the layer of insulating material is positioned between the second source/drain conductive contact and the gate structures of the second pair of transistor devices.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict one illustrative prior art method of forming a gate structure of the transistors using a so-called "replacement gate" technique; and FIGS. 2A-2F depict various illustrative methods of forming different spacer structures on integrated circuit products having different gate pitch dimensions and the resulting products.

Figure 2C:
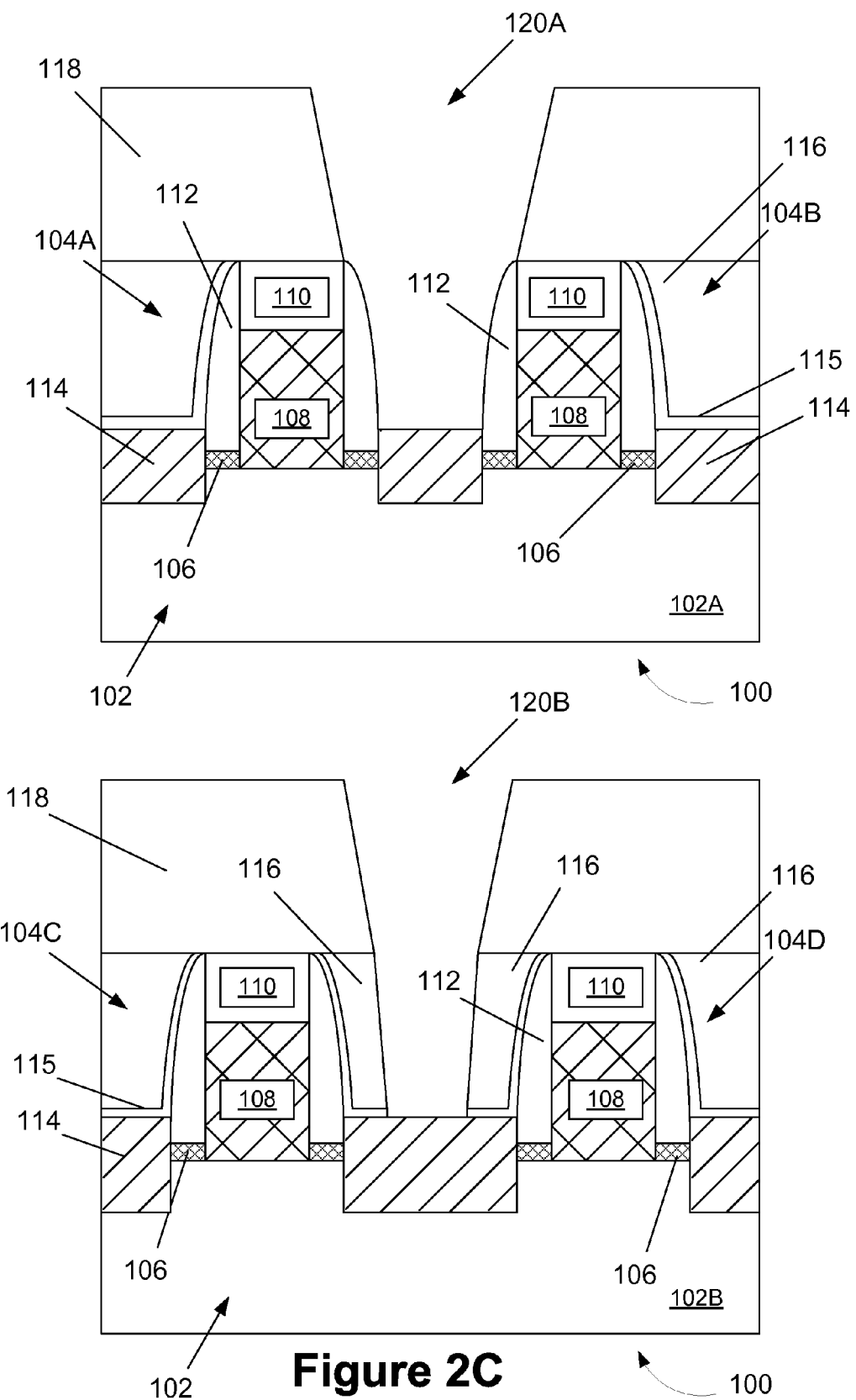

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming different spacer structures on integrated circuit products having different gate pitch dimensions and the resulting products. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail. The various layers of material depicted in the following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

As will be appreciated by those skilled in the art after a complete reading of the present application, the methods and structures disclosed herein may be used when forming either planar or 3D transistor devices. For purposes of explanation only, the inventions disclosed herein will be described in the context of forming illustrative planar FET devices. The transistor devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 100 depicted in the drawings is formed above an illustrative substrate 102 that may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

As noted above, the presently disclosed inventions are generally directed to forming different types of gate sidewall spacer structures on integrated circuit products that include transistor devices formed with different gate pitch dimensions. For example, transistor devices that are formed on a tight pitch pattern may have a first type of spacer structure, while transistor devices formed on the same die with a more relaxed or "looser" gate pitch pattern may be formed with a second spacer structure that is different from the first spacer structure in terms of material and/or configuration of the spacer structures. Accordingly, FIG. 2A depicts portions or regions 102A, 102B of the same die or substrate 102 wherein the devices 104A, 104B depicted in the upper part of FIG. 2A are formed on a gate pitch pattern P1, while the devices 104C, 104D are formed using a gate pitch pattern P2. In this example, the pitch pattern P1 is less than the pitch pattern P2. Using current day technology, the pitch pattern P1 may be considered a "tight" pitch pattern (e.g., 60 nm or less), while the pitch pattern P2 may be considered to be a "loose" pitch pattern (e.g., 70 nm or greater). In modern integrated circuit products, it is common to have different regions of the circuitry formed on a single die have transistor devices that are formed with different gate pitches. For example, devices formed in some circuits of a product, e.g., ring oscillator, may be formed to a very tight pitch pattern, while other circuits on the same die, e.g., I/O circuits, may be formed with devices that have a looser gate pitch pattern. The regions 102A, 102B depicted in the attached figures may be positioned side-by-side on the die, or they may be spaced apart from one another on the die. The overall size of the regions 102A, 102B and the number of transistor devices within each region may vary depending upon the particular application.

In the example disclosed herein, the transistors 104A-D will be formed using a replacement gate technique, such as the illustrative replacement gate process described in the background section of this application. In general, FIG. 2A depicts the product 100 after sacrificial gate structures (not shown) were removed and schematically depicted replacement gate structures 108 were formed for the devices 104A-D. Several other structures are depicted in FIG. 2A: sidewall spacers 112, etch stop liners 115, gate cap layers 110, a layer of insulating material 116, raised source/drain regions 114 and remaining portions of a sacrificial gate insulation layer 106. The sidewall spacers 112, liner layers 115 and the gate cap layers 110 may be comprised of a variety of different materials, e.g., silicon nitride, silicon oxynitride, etc. The layer of insulating material 116 may be comprised of a material such as silicon dioxide. Various known process operations are performed to form the illustrative raised source/drain regions 114 in the substrate 102 adjacent the sidewall spacer 112. However, such raised source/drain regions 114 need not be formed in all applications, and the disclosed inventions should not be considered to be limited to such an illustrative configuration.

The replacement gate structures 108 that are described herein are intended to be representative in nature of any gate structure that may be formed on semiconductor devices using replacement gate techniques. Of course, the materials of construction used for the replacement gate structure 108 on a P-type device may be different than the materials used for the replacement gate structure 108 on an N-type device. The devices 104A-D may each have the same gate structure (e.g., they may all be N-type devices) or they may each have different gate structures in terms of materials. In one illustrative embodiment, the schematically depicted materials for the replacement gate structure 108 include an illustrative gate insulation layer (not separately shown) and an illustrative gate electrode (not separately shown). In one illustrative embodiment, a conformal CVD or ALD process may be performed to form a gate insulation layer comprised of a high-k layer of insulating material, $HfO_2$, $Al_2O_3$, etc. Thereafter, one or more metal layers (that will become the gate electrode) may be deposited above the product 100 and in the replacement gate cavities using, for example, the prior art replacement gate techniques described in the background section of this application.

Then, as shown in FIG. 2B, a layer of insulating material 118 is blanket-deposited on the product 100. In one illustrative example, the layer of insulating material 118 may be a silicon dioxide material that is formed by performing a CVD process, a low-k material (k value less than about 3.9 for purposes of this application and the claims). The layer of insulating material 118 may be formed to any desired thickness.

The next process operation involves formation of conductive contacts to the source/drain regions of the devices, e.g., to the raised source/drain regions 114 in the depicted examples. Given the relatively tight pitch (P1) of the devices formed above region 102A, the conductive source/drain contacts to the devices in that region must be formed using self-aligned contact formation techniques, as generally described in the background section of this application. Accordingly, FIG. 2C depicts the product 100 after several process operations were performed. First, contact openings 120A, 120B were formed in the layers of insulating material 118, 116 by performing one or more etching processes through a patterned etch mask (not shown), such as a patterned layer of photoresist material. This etching process stops on the liner layer 115. Then, a relatively brief, so-called "punch-through" etching process was performed to remove at least portions of the liner layer 115 so that conductive contact can be made to the underlying source/drain regions 114. For ease of reference, the formation of only the contact for contacting the source/drain region between the two sets of devices, i.e., 104A-B and 104C-D, will be depicted in the attached drawings. Those skilled in the art will understand that such contact openings and contacts are formed to the source/drain regions on each side of the individual devices 104A-D.

With continuing reference to FIG. 2C, given the relative tight pitch P1 (FIG. 2A) of the devices 104A-B, the formation of the contact opening 120A results in the consumption of substantially all of the layer of insulating material 116 between the devices 104A-B formed above the region 102A of the die 102. Additionally, the punch-through etching process consumes substantially all of the liner layer 115 between the two devices 104A-B. In practice, some of the sidewalls spacers 112 exposed by the contact opening 120A may also be consumed at this point in the process flow, but such a situation is not depicted in FIG. 2C. The net result is that the facing sidewall spacers 112 on the devices 104A-B are exposed at this point in the process flow. In contrast, given the relative loose pitch P2 (FIG. 2A) of the devices 104C-D, the formation of the contact opening 120B does not consume all of the layer of insulating material 116 between the devices 104C-D formed above the region 102B of the die 102. That is, portions of the layer of insulating material 116 remain positioned between the contact opening 120B and the adjacent devices 104C-D. Stated another way, portions of the layer of insulating material 116 still protect the liner layer 115 and the underlying spacers 112 on the devices 104C-D.

Figure 2D:
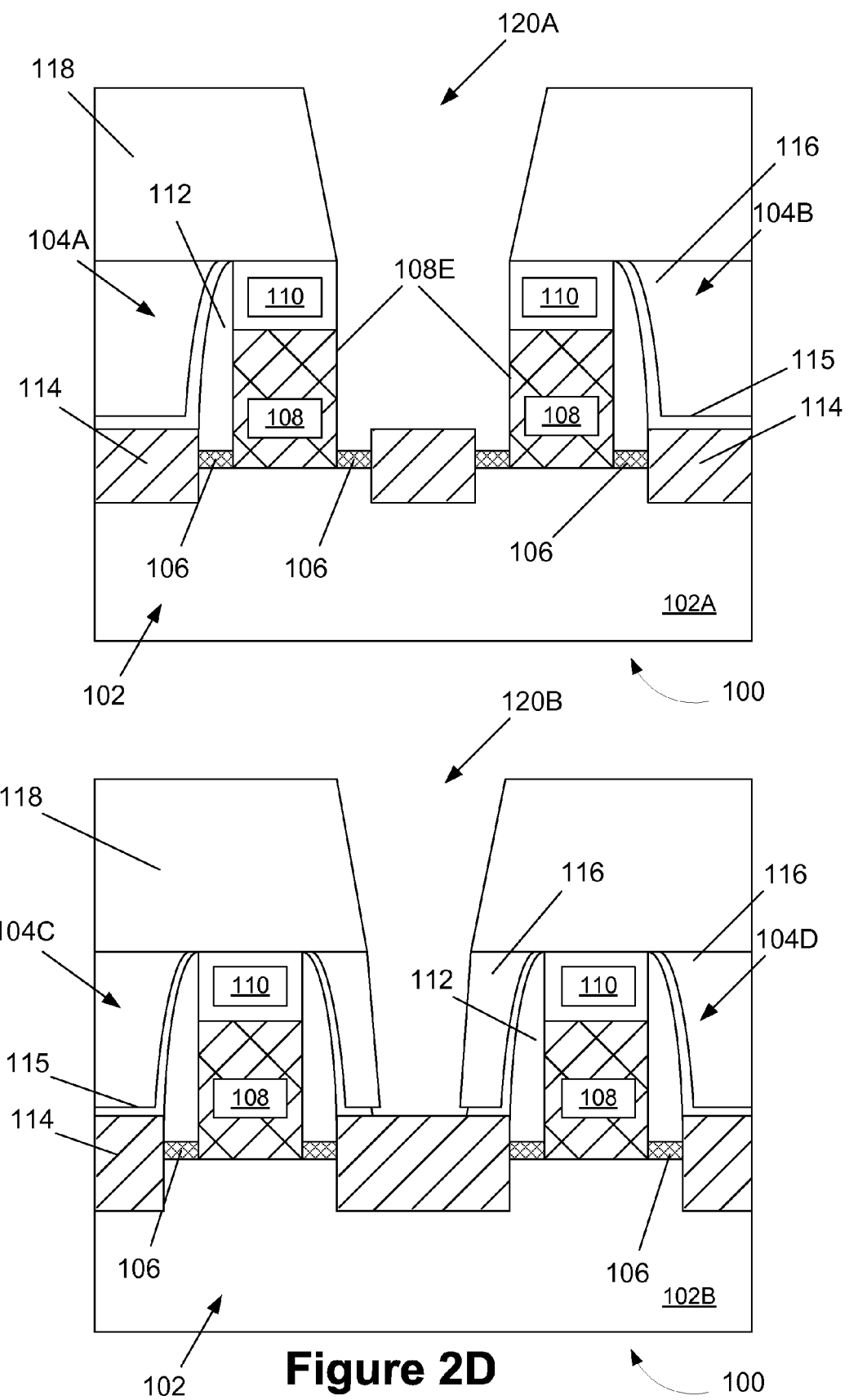

FIG. 2D depicts the product 100 after an etching process was performed through the contact opening 120A to remove the exposed facing sidewall spacers 112 on the devices 104A-B. This etching process exposes the sidewalls 108E of the replacement gate structures 108. More specifically, the high-k gate insulation layer (not separately) shown of the replacement gate structure 108 will be exposed when the sidewall spacers 112 are removed. Note that, during this etching process, the liner layer 115 under the layer of insulating material 116 in the opening 120B may be slightly etched. In one illustrative embodiment, the etching process that is performed to remove the exposed facing spacers 112 is a timed, wet, isotropic etching process. Also note that, in the depicted example, removal of the facing spacers 112 exposed by the opening 120A also exposes the remaining portions of the sacrificial gate insulation layer 106 that were originally positioned under the spacers 112 when they were formed. If desired, these portions 106 of the original sacrificial gate insulation layer may be removed by performing a brief etching process. However, the portions 106 will be depicted as remaining in place in the example disclosed herein.

Figure 2E:
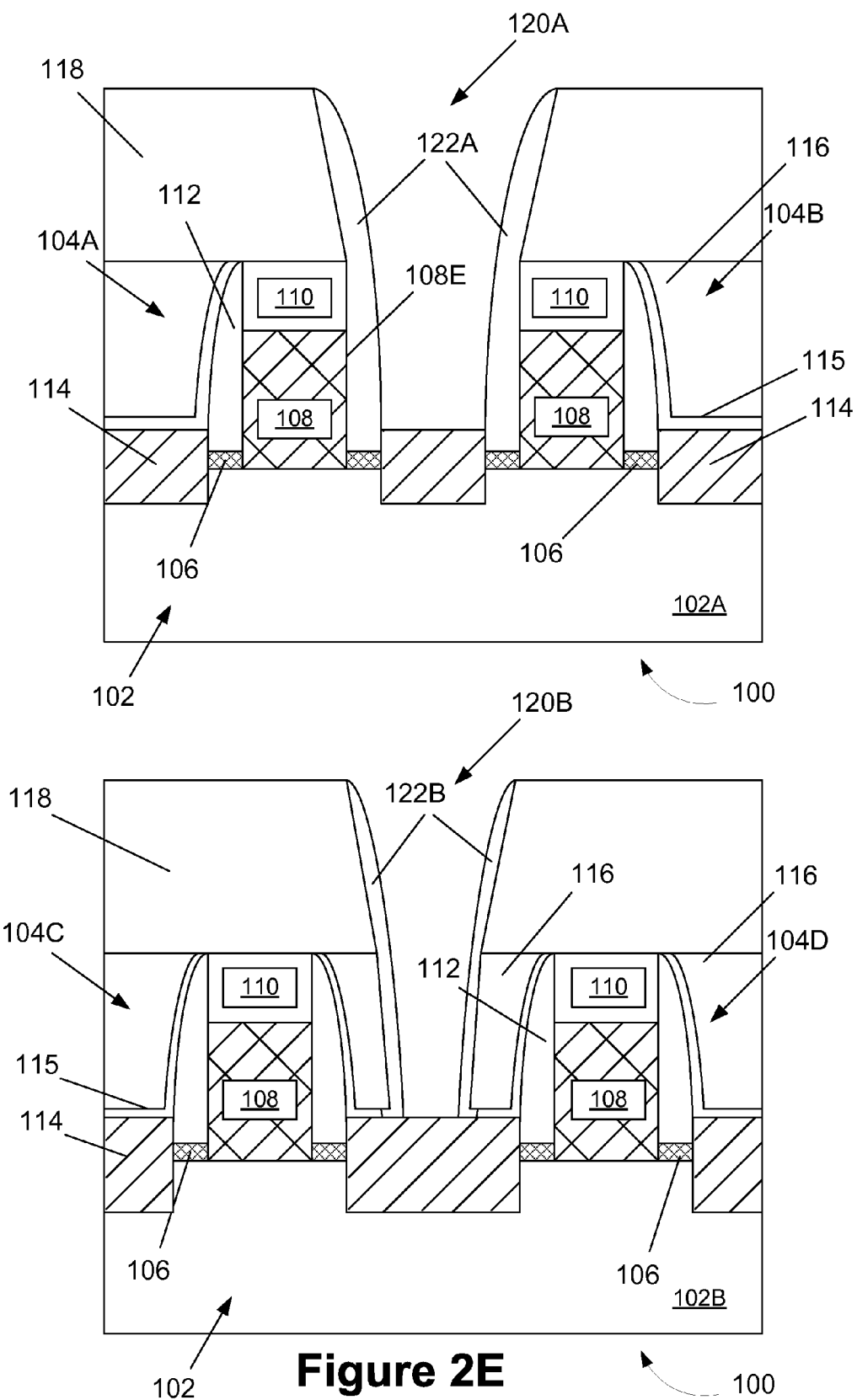

Next, as shown in FIG. 2E, first and second low-k sidewall spacers 122A, 122B are formed in the openings 120A, 120B, respectively. As depicted, the first low-k spacers 122A abut and engage the exposed facing edges 108E of the replacement gate structures 108 of the devices 104A-B. In contrast, the second low-k spacers 122B abut and engage the surfaces of the layer of insulating material 116 within the opening 120B. The first and second low-k sidewall spacers 122A, 122B may be formed by performing a common deposition/etching process sequence, i.e., depositing a layer of low-k insulating material and thereafter performing an anisotropic etching process to define both the first and second low-k sidewall spacers. As used herein and in the claims, the term "low-k spacer" or "low-k spacer material" should be understood to mean a material having a dielectric constant of less than 7.9. Illustrative examples of such low-k materials are silicon-carbon-nitride (SiCN), silicon-carbon-boron-nitride (SiCBN), etc. The base thickness of the low-k sidewall spacers 122A, 122B may vary depending upon the particular application. In general, the base thickness of the spacers 122A should be greater than the base thickness of the spacers 122B due to the prior removal of the facing spacers 112 exposed by the opening 120A. In one illustrative embodiment, the low-k sidewall spacers 122A and 122B may have a thickness at its base of about 3-10 nm. After the low-k spacers 122A, 122B are formed, all subsequent process temperatures will typically be below or equal to about 400° C. to be compatible with gate stack reliability, which prevents any depletion of the carbon and boron (to the extent such materials are present) from such low-k materials.

Figure 2F:
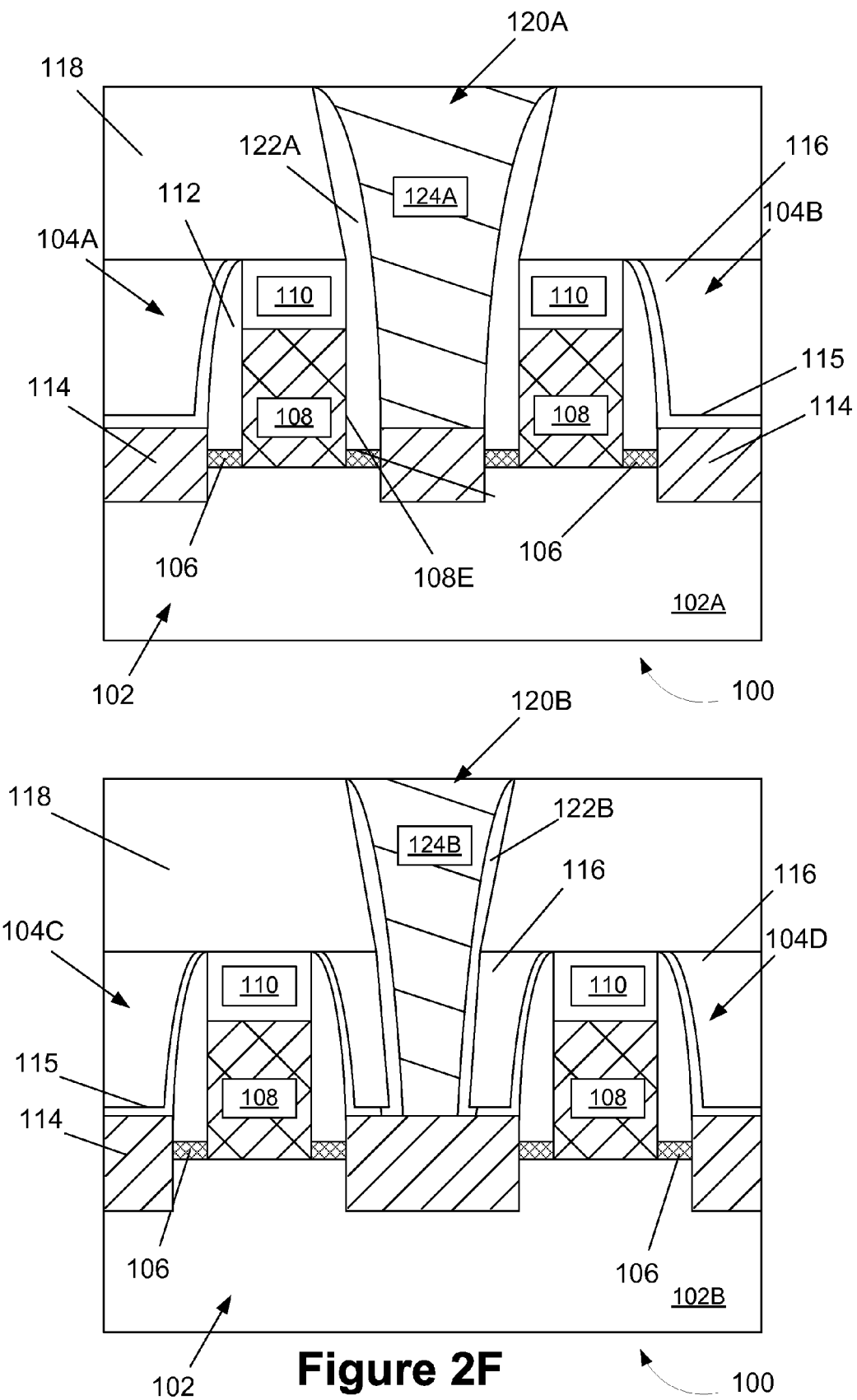

FIG. 2F depicts the product 100 after traditional manufacturing operations were performed to form schematically depicted source/drain contacts 124A/124B in the contact openings 120A, 120B respectively. The contacts 124A/124B may be made of any desired material, e.g., tungsten, and they may include one or more barrier metal layers (not shown). At the point of fabrication depicted in FIG. 2F, traditional manufacturing operations may be performed to complete the formation of the product 100. For example, various metallization layers may be formed above the product 100 using known processing techniques.

As will be appreciated by those skilled in the art after a complete reading of the present application, the methods and devices disclosed herein provide an advantage as it relates to the semiconductor products generally described in the background section of this application. More specifically, due to the use of the low-k spacers 122A, 122B with the novel devices disclosed herein, the gate-to-contact capacitance may be less than the corresponding gate-to-contact capacitance using prior art structures. Accordingly, the products disclosed herein may operate at faster switching speeds as it will take less time for the novel devices disclosed herein to charge and discharge the gate-to-contact capacitor each time the transistor is turned on-off.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming source/drain conductive contacts to first and second source/drain regions, said first source/drain region being positioned between a first pair of transistor devices having a first gate pitch dimension, said second source/drain region being positioned between a second pair of transistor devices having a second gate pitch dimension that is greater than said first gate pitch dimension, wherein said first and second pairs of transistor devices have a gate structure, a gate cap layer positioned above said gate structure, and sidewall spacers positioned adjacent the gate structure, the method comprising:

forming a first layer of insulating material above said first and second source/drain regions;

forming a second layer of insulating material above said first layer of insulating material;

forming first and second contact openings above said first and second source/drain regions, wherein forming said first contact opening removes substantially all of said first layer of insulating material positioned above said first source/drain region and between facing sidewall spacers on said first pair of transistor devices having said first gate pitch, and wherein forming said second contact opening removes some, but not all, of said first layer of insulating material positioned above said second source/drain region and between facing sidewall spacers on said second pair of transistor devices having said second gate pitch, so as to provide a remaining portion of said first layer of insulating material over said sidewall spacers on said second pair of transistor devices, said second contact opening extending through a portion of said first layer of insulating material;

performing an etching process through said first contact opening to remove the facing sidewall spacers on said first pair of transistor devices and thereby exposing facing edges of the gate structures and the gate cap layers on said first pair of transistor devices;

performing a common deposition and etch process sequence to form first and second low-k sidewall spacers within said first and second contact openings, respectively, wherein said first low-k sidewall spacer contacts the exposed facing edges of the gate structure of said first pair of transistor devices and said second low-k sidewall spacer is formed on said remaining portion of said first layer of insulating material within said second contact opening;

forming a first source/drain conductive contact in said first contact opening contacting said first source/drain region and said first low-k sidewall spacer; and forming a second source/drain conductive contact in said second contact opening contacting said second source/drain region and said second low-k sidewall spacer.

2. The method of claim 1, wherein said gate structures are replacement gate structures that are comprised of a high-k gate insulation layer and at least one layer of metal that acts as a portion of a gate electrode.

3. The method of claim 2, wherein said first and second contact openings extend through said second layer of insulating material.

4. The method of claim 3, wherein said first low-k sidewall spacer engages a portion of said second layer of insulating material within said first contact opening and wherein said second low-k sidewall spacer engages a portion of said second layer of insulating material within said second contact opening.

5. The method of claim 1, wherein said source/drain conductive contacts are comprised of tungsten.

6. The method of claim 1, wherein said first gate pitch is 60 nm or less.

7. The method of claim 1, wherein said second layer of insulating material is formed on said first layer of insulating material.

8. The method of claim 1, wherein said source/drain regions are raised source/drain regions comprised of an epitaxially deposited layer of semiconductor material.

9. The method of claim 1, wherein said gate structure comprises a gate insulation layer and a gate electrode formed above said gate insulation layer, and performing said etching process through said first contact opening to remove said facing sidewall spacers on said first pair of transistor devices and thereby exposing facing edges of said gate structures and said gate cap layers on said first pair of transistor devices comprises exposing at least one of said gate insulation layer or said gate electrode.

10. A method of forming source/drain conductive contacts to first and second source/drain regions, said first source/drain region being positioned between a first pair of transistor devices having a first gate pitch dimension, said second source/drain region being positioned between a second pair of transistor devices having a second gate pitch dimension that is greater than said first gate pitch dimension, wherein said first and second pairs of transistor devices have a replacement gate structure, a gate cap layer positioned above said replacement gate structure, and sidewall spacers positioned adjacent said replacement gate structure, the method comprising:

forming a first layer of insulating material above said first and second source/drain regions;

forming a second layer of insulating material above said first layer of insulating material;

forming first and second contact openings above said first and second source/drain regions, wherein forming said first contact opening removes substantially all of said first layer of insulating material positioned above said first source/drain region and between facing sidewall spacers on said first pair of transistor devices having said first gate pitch, and wherein forming said second contact opening removes some, but not all, of said first layer of insulating material positioned above said second source/drain region and between facing sidewall spacers on said second pair of transistor devices having said second gate pitch, said second contact opening extending through a portion of said first layer of insulating material;

performing an etching process through said first contact opening to remove said facing sidewall spacers on said first pair of transistor devices and thereby exposing a high-k gate insulation layer on each of the facing edges of said replacement gate structures and said gate cap layers on said first pair of transistor devices;

performing a common deposition and etch process sequence to form first and second low-k sidewall spacers within said first and second contact openings, respectively, wherein said first low-k sidewall spacer contacts said high-k gate insulation layer on each of said exposed facing edges of said replacement gate structure of said first pair of transistor devices and said second low-k sidewall spacer is formed on said first layer of insulating material within said second contact opening;

forming a first source/drain conductive contact in said first contact opening contacting said first source/drain region and said first low-k sidewall spacer; and forming a second source/drain conductive contact in said second contact opening contacting said second source/drain region and said second low-k sidewall spacer.

11. The method of claim 10, wherein said first and second contact openings extend through said second layer of insulating material.

12. The method of claim 11, wherein said first low-k sidewall spacer engages a portion of said second layer of insulating material within said first contact opening and wherein said second low-k sidewall spacer engages a portion of said second layer of insulating material within said second contact opening.

13. The method of claim 12, wherein said first gate pitch is 60 nm or less.

14. The method of claim 10, wherein said second layer of insulating material is formed on said first layer of insulating material.

15. The method of claim 10, wherein said source/drain regions are raised source/drain regions comprised of an epitaxially deposited layer of semiconductor material.

16. The method of claim 10, wherein said gate structure comprises said high-k gate insulation layer and a gate electrode formed above said high-k gate insulation layer.

* * * * *